(12) United States Patent
Waldauf et al.

(10) Patent No.: US 7,948,251 B2
(45) Date of Patent: May 24, 2011

(54) GUIDE DEVICE AND TEST APPARATUS FOR ELECTRONIC DEVICES

(75) Inventors: Alexander Waldauf, Kolbermoor (DE); Alfred Langer, Kolbermoor (DE)

(73) Assignee: Rasco GmbH, Kolbermoor (DE)

( * ) Notice: Subject to any disclaimer, the term of this patent is extended or adjusted under 35 U.S.C. 154(b) by 464 days.

(21) Appl. No.: 12/018,562

(22) Filed: Jan. 23, 2008

(65) Prior Publication Data

US 2008/0278146 A1  Nov. 13, 2008

(30) Foreign Application Priority Data

Jan. 24, 2007  (EP) ..................... 07001470

(51) Int. Cl.
*G01R 31/00* (2006.01)
(52) U.S. Cl. ................................. 324/750.04
(58) Field of Classification Search .................. 324/765, 324/754, 760, 761–762, 158.1; 257/48; 438/14–18
See application file for complete search history.

(56) References Cited

U.S. PATENT DOCUMENTS

| 4,579,527 | A | 4/1986 | Wedel et al. |
| 6,069,482 | A * | 5/2000 | Hilton .......................... 324/755 |
| 6,251,835 | B1 | 6/2001 | Chu et al. |
| 6,744,268 | B2 * | 6/2004 | Hollman ....................... 324/758 |
| 7,245,137 | B2 * | 7/2007 | Eldridge et al. ............... 324/755 |

FOREIGN PATENT DOCUMENTS

| DE | 19708291 C | 9/1998 |
| EP | 0291144 A | 11/1988 |

* cited by examiner

*Primary Examiner* — Ha Tran T Nguyen
*Assistant Examiner* — Tung X. Nguyen
(74) *Attorney, Agent, or Firm* — Kenyon & Kenyon LLP

(57) ABSTRACT

The present invention relates to a guide device comprising a baseplate unit having formed therein a guide channel for guiding electronic devices, wherein at least two portions of the baseplate unit are spatially fixed, said guide device being characterized in that means for compensating the thermal expansion of the baseplate unit are provided. The invention additionally relates to a test apparatus which comprises the guide device according to the present invention.

31 Claims, 4 Drawing Sheets

GUIDE DEVICE AND TEST APPARATUS FOR ELECTRONIC DEVICES

CROSS-REFERENCE TO RELATED APPLICATIONS

This application claims the benefit of priority afforded by European Patent Application No. 07001470.9 entitled "Guide Device and Test Apparatus for Electronic Devices" filed on Jan. 24, 2007.

FIELD OF THE INVENTION

The present invention relates to a guide device which comprises a baseplate unit having formed therein a guide channel for guiding electronic devices, and in the case of which at least two portions of the baseplate unit are spatially fixed. The invention additionally relates to a test apparatus for electronic devices.

PRIOR ART

For testing electronic devices, such as integrated circuits, at different temperatures, test apparatuses are used in which the electronic devices are heated or cooled for a short period of time.

In order to achieve a high throughput of electronic devices to be tested, guide means are used, which comprise a baseplate with a guide channel. The guide device is preferably arranged in an upright position so that the electronic devices can be introduced by a feeder into the guide channel where they will, due to the force of gravity acting thereon, fall down to the location at which their temperature is adjusted. At this location a stopper is provided, which can be pushed into the guide channel so as to stop the electronic devices.

Document DE19708291C2 discloses a guide means for electronic devices. This guide means comprises a baseplate with a guide channel and guide elements.

Temperature adjustment can be carried out e.g. in a temperature chamber, e.g. by means of cold or hot gas, in particular nitrogen or air, in the temperature range of approx. −50° C. and +150° C. Subsequently, the electronic devices enter an unloading apparatus which is able to e.g. sort the electronic devices depending on whether or not they passed the test.

DESCRIPTION OF THE INVENTION

When the electronic devices are to be tested e.g. also at ambient temperature, a further test point can be provided e.g. above the temperature chamber. When testing has been finished at this location, the electronic devices can enter the temperature adjustment chamber in their further progress along the guide means; in said temperature adjustment chamber there is a second test point for testing the electronic devices at high or low temperatures. In this case, the guide means must be spatially fixed at two test points so that precise tests can be carried out.

The guide means known from the prior art is, however, disadvantageous insofar as temperature variations of the baseplate and of the guide elements lead to stresses when the baseplate is spatially fixed at two points. In the above-described test device, this is the case at the locations at which temperature adjustment and the testing of the electronic devices take place.

The present invention is based on the problem of preventing stresses which may occur due to the expansion or the contraction of the materials of the guide means at different temperatures.

The above-mentioned problem is solved by a guide device according to the present invention, which comprises a baseplate unit having formed therein a guide channel for guiding electronic devices, wherein at least two portions of the baseplate unit are spatially fixed, said guide device being characterized in that means for compensating the thermal expansion of the baseplate unit are provided.

The guide device according to the present invention has the advantage that the means provided compensate the thermal expansion of the baseplate unit so that an occurrence of stresses in the baseplate unit, which may e.g. lead to a deformation of the guide channel, will be avoided.

Further developments of the guide device according to the present invention will be described in the following.

One further development of the guide device according to the present invention is so implemented that the means for compensating the thermal expansion of the baseplate unit can comprise a compensating region of the baseplate unit. The means for compensating the thermal expansion of the baseplate unit can therefore be limited to a compensating region of said baseplate unit.

A further development of the above-mentioned further development is so implemented that the baseplate unit comprises a first and a second sub-baseplate in the direction of the guide channel, said sub-baseplates having formed between them an expansion gap in the compensating region of the baseplate unit. Simple means for compensating the thermal expansion of the baseplate unit are provided in this way.

A further development of the above-mentioned further development is so implemented that the first sub-baseplate can comprise a projection and the second sub-baseplate can comprise a recess, said projection and said recess being so implemented that they interengage in such a way that they are movable relative to one another in the direction of the guide channel, and that the projection bridges the expansion gap so as to guide the electronic devices. This further development has the advantage that electronic devices, which move along the guide channel, will not cant on the expansion gap and get stuck.

A further development of the two last-mentioned further developments is to so implemented that one of the sub-baseplates comprises a pin and the other sub-baseplate comprises a recess for accommodating the pin, said pin and said recess being implemented complementarily to one another, when seen in a cross-sectional view at right angles to the direction of the guide channel, and said pin being movable relative to said recess in the direction of the guide channel. A stable connection of the two sub-baseplates in a direction transversely to the guide channel direction is achieved in this way, the movability in the direction of the guide channel being, however, maintained.

Another further development of the guide device according to the present invention is so implemented that a guiderail means is provided along the guide channel so as to cover said guide channel at least partially. This has the advantage that, in the case of an essentially vertical arrangement of the guide device, the electronic devices will also be guided from an open side of the guide channel. In this way, the electronic devices can be guided reliably and stably in the guide channel without any risk of escaping from the guide channel. The guide rail means can here be arranged such that it covers only part of the guide channel in the longitudinal direction, and in particular such that it does not cover the guide channel at the end portions thereof.

Another further development of the above-mentioned further development is so implemented that portions of the guiderail means, preferably end portions of the guiderail means which are positioned in the direction of the guide channel, are spatially fixed, and that means for compensating the thermal expansion of the at least one guiderail means can be provided. Also longitudinal dilations and longitudinal contractions of the guide rail means caused by the influence of heat can be compensated in this way.

Another further development of the penultimate further development is so implemented that at least two areas of the guiderail means are connected to the baseplate unit, and that the guide device can comprise means for compensating the thermal expansion of the baseplate unit and/or for compensating the thermal expansion of the guiderail means. In this way, stresses in the guide rail means can be avoided, which could otherwise occur due to a thermal expansion of the baseplate unit and/or of the guide rail means.

Another further development is so implemented that the guiderail means can comprise at least one guiderail, and that at least two areas of the, or of each guiderail are connected to the baseplate unit. A simple embodiment of the guide rail means is provided in this way.

Another further development is so implemented that the guiderail means can comprise a first and a second guiderail, each of said guiderails being arranged along the guide channel in such a way that, when seen in a cross-sectional view, the guide channel is covered at least partially on both sides. Due to the use of two guide rails, which each partially cover the guide channel from a respective side thereof, these guide rails can be used on different baseplate units, when, e.g. for different sizes of the electronic devices, the baseplate unit is replaced by some other baseplate unit having e.g. a broader guide channel.

Another further development is so implemented that the means for compensating the thermal expansion of the at least one guiderail and/or for compensating the thermal expansion of the baseplate unit can comprise a compensating region of the guiderail means. In this way, the compensating means are spatially limited to a compensating region of the guide rail means.

A further development of the above-mentioned further development is so implemented that the compensating region of the guiderail means can comprise an expandable portion of each guiderail. A simple embodiment of the compensating region is provided in this way.

A further development of the above-mentioned further development is so implemented that the expandable portion of each guiderail can be meandrous in shape. It is thus possible to provide a simple embodiment of the expandable portion in the case of which the meandrous portion is deformable due to the elasticity of the material in question.

A further development of the above-mentioned further development is so implemented that the meandrous portion of each guiderail comprises alternating transverse indentations. This allows an easy realization of the meandrous portion by providing indentations in an alternate mode of arrangement on both sides of the guide rail.

Another further development is so implemented that each guiderail can comprises a first and a second sub-guiderail, said sub-guiderails having an expansion gap formed between them. In this way, an alternative to the meandrous embodiment of the compensating region is provided.

A further development of the above-mentioned further development is so implemented that the first sub-guiderail can be provided with an extension which, when the guide channel is seen from above, is arranged below the second sub-guiderail such that it is movable relative thereto. This extension guarantees that electronic devices moving in the guide channel will not get stuck in the expansion gap between the two sub-guiderails.

A further development of the guide device according to the present invention and of all the further developments of said guide device including guide rail means is so implemented that the baseplate unit and the guide rail means can have arranged between them a spacer for adapting the distance of the guide rail means from the guide channel. It is thus possible to adapt the guide device to different thicknesses of the electronic devices.

The present invention also provides a test apparatus for electronic devices, which comprises a guide device according to the present invention or one of the further developments of said guide device. In a test apparatus according to the present invention, thermal expansions of the baseplate unit and/or of the guide rail means are compensated so that trouble-free testing will be guaranteed.

A further development of the test apparatus according to the present invention is so implemented that it can comprise a feeder for charging the guide channel with electronic devices. Fast charging of the guide channel with electronic devices can be provided in this way.

A further development of the test apparatus according to the present invention and of the further development thereof is so implemented that the guide channel is arranged in an essentially upright position and the electronic devices are adapted to be moved through the guide channel by means of the force of gravity acting thereon. It is thus possible to achieve a high test rate.

Another further development of the test apparatus according to the present invention and of the further developments thereof is so implemented that a stopper for stopping the electronic devices in the guide channel can be provided. It is thus possible to easily stop the electronic devices at the temperature adjustment points so as to carry out the necessary tests.

Another further development of the test apparatus according to the present invention or of one of its further developments is so implemented that at least one temperature adjustment unit for electronic devices can be provided. It is thus possible to bring the electronic devices to a high or to a low temperature and to test their function.

The various further developments can be used independently of one another or they can be combined with one another in a suitable way.

Further preferred embodiments of the present invention will be described hereinbelow with reference to the drawings.

DESCRIPTION OF THE EMBODIMENTS

Figure 1A:
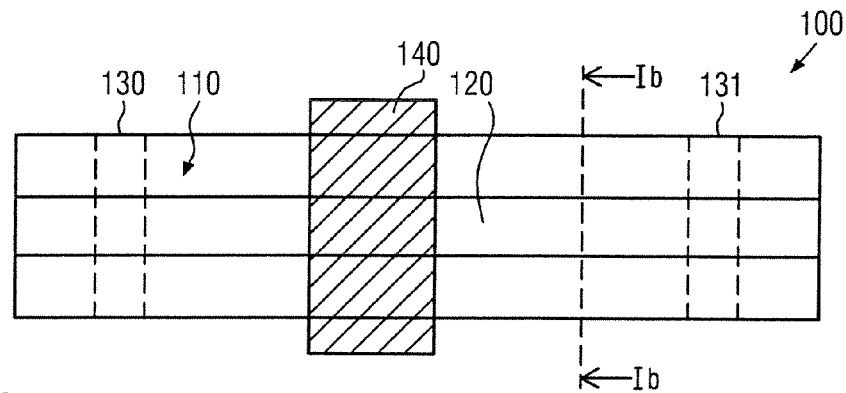
FIG. 1a, b shows a first embodiment of the guide device according to the present invention.

FIG. 1a, b shows a first embodiment of the guide device according to the present invention. The guide device 100 comprises a baseplate unit 110 having formed therein a guide channel 120 used for guiding electronic devices. Two portions 130, 131 of the baseplate unit 110 are spatially fixed. These portions 130, 131 can, in a test apparatus, correspond to the locations at which the electronic devices are exposed to various temperatures. The guide device 100 according to the present invention comprises means 140 for compensating a thermal expansion of the baseplate unit 110. Said means 140 serve to compensate length variations of the baseplate means caused by the influence of heat, e.g. at the portions 130, 131, so that stresses will be avoided and so that in particular the guide channel 120 will be prevented from bending.

Figure 1B:
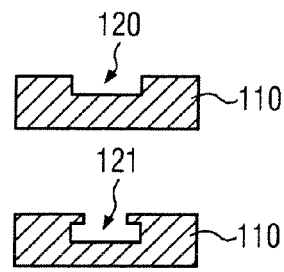

The two subfigures of FIG. 1 show possible embodiments of the guide channel 120 and represent a sectional view of the baseplate unit 110 in direction I b in FIG. 1a. These cross-sectional configurations of the guide channel 120 can be used in all the embodiments of the present invention.

Figure 2:
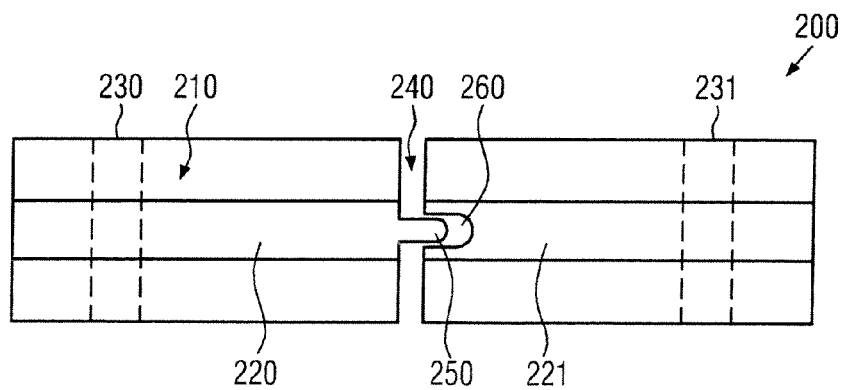
FIG. 2 shows a second embodiment of the guide device according to the present invention, FIG. 3a, b shows a third embodiment of the guide device according to the present invention.

FIG. 2 shows a second embodiment of the guide device according to the present invention. In the descriptions of this figure and of the subsequent figures, identical reference numerals correspond to identical elements; only the 100-digit changes. In the second embodiment 200 the baseplate unit consists of first and second sub-baseplates 210, 211 and the means for compensating the thermal expansion of the baseplate unit comprise an expansion gap 240. The first sub-baseplate 210 comprises a projection 250 and the second sub-baseplate comprises a recess 260. The projection 250 and the recess 260 are so implemented that the projection 250 and the recess 260 interengage in such a way that they are movable relative to one another in the direction of the guide channel, and that the projection 250 bridges the expansion gap 240 so as to guide electronic devices.

Figure 3A:
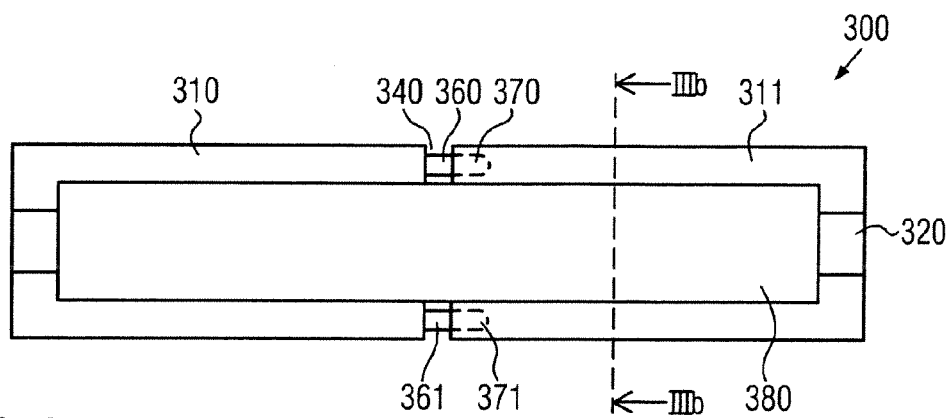
Figure 3B:
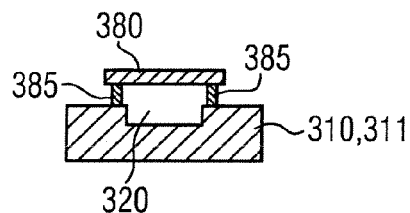

FIG. 3a, b shows a third embodiment of the guide device according to the present invention. In this embodiment, the first sub-baseplate 310 is provided with pins 360, 361 and the second sub-baseplate 311 comprises recesses 370, 371. The pins 360, 361 and the recesses 370, 371 are so implemented that the pins 360, 361 are able to move relative to the recesses 370, 371 in the direction of the guide channel. Furthermore, the guide device according to this embodiment comprises a guiderail means 380 which covers the guide channel 320. FIG. 3b shows that a spacer 385 is provided, which makes the guiderail means 380 extend in spaced relationship with the guide channel 320.

Figure 4:
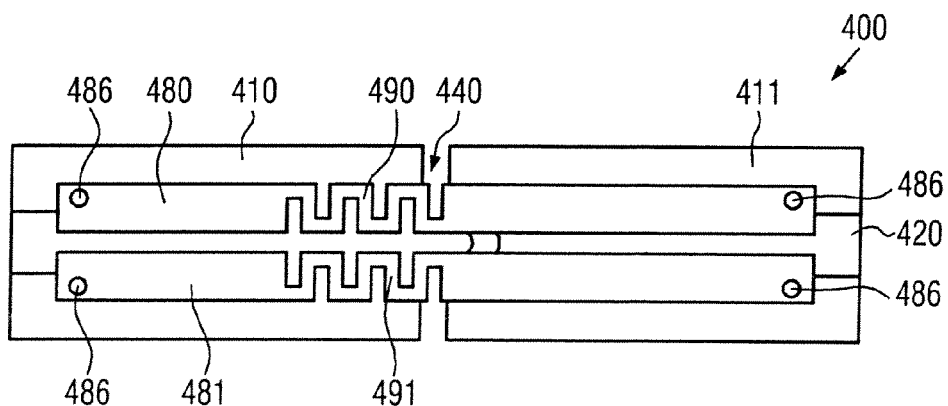
FIG. 4 shows a fourth embodiment of the guide device according to the present invention, FIG. 5a, b shows a guide rail means that can be used in the guide device according to the present invention.

FIG. 4 shows a fourth embodiment of the guide device 400 according to the present invention; in the case of this embodiment, the guide channel 420 is partially covered from both sides by a respective guiderail 480, 481, and each guiderail is connected to the baseplate unit in areas 486. For compensating the thermal expansion of the baseplate unit and/or of the guiderail 480, 481, respective expandable compensating regions 490, 491 are provided therein, said compensating regions being e.g. meandrous in shape. When the fastening areas 486 move away from each other or towards each other, the meandrous regions 490, 491 will be elongated or compressed.

Figure 5A:
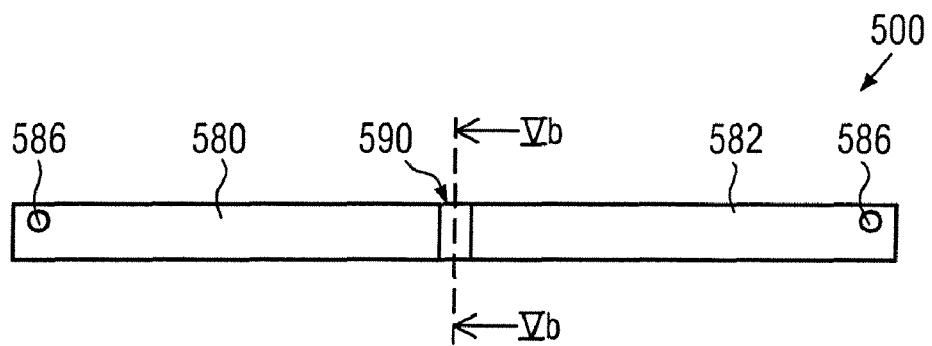
Figure 5B:
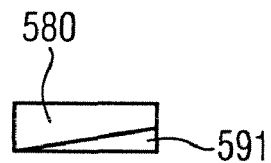

FIG. 5a, b shows an alternative embodiment of a guiderail 580, 582 comprising a compensating region 590. The first sub-guiderail 580 is provided with an extension 591, which, when the guide channel is seen from above, is arranged below the second sub-guiderail 582 such that it is movable relative thereto. FIG. 5b shows a view from the end face of the sub-guiderail 580. The extension 591 has here, by way of example, a triangular cross-section.

Figure 6:
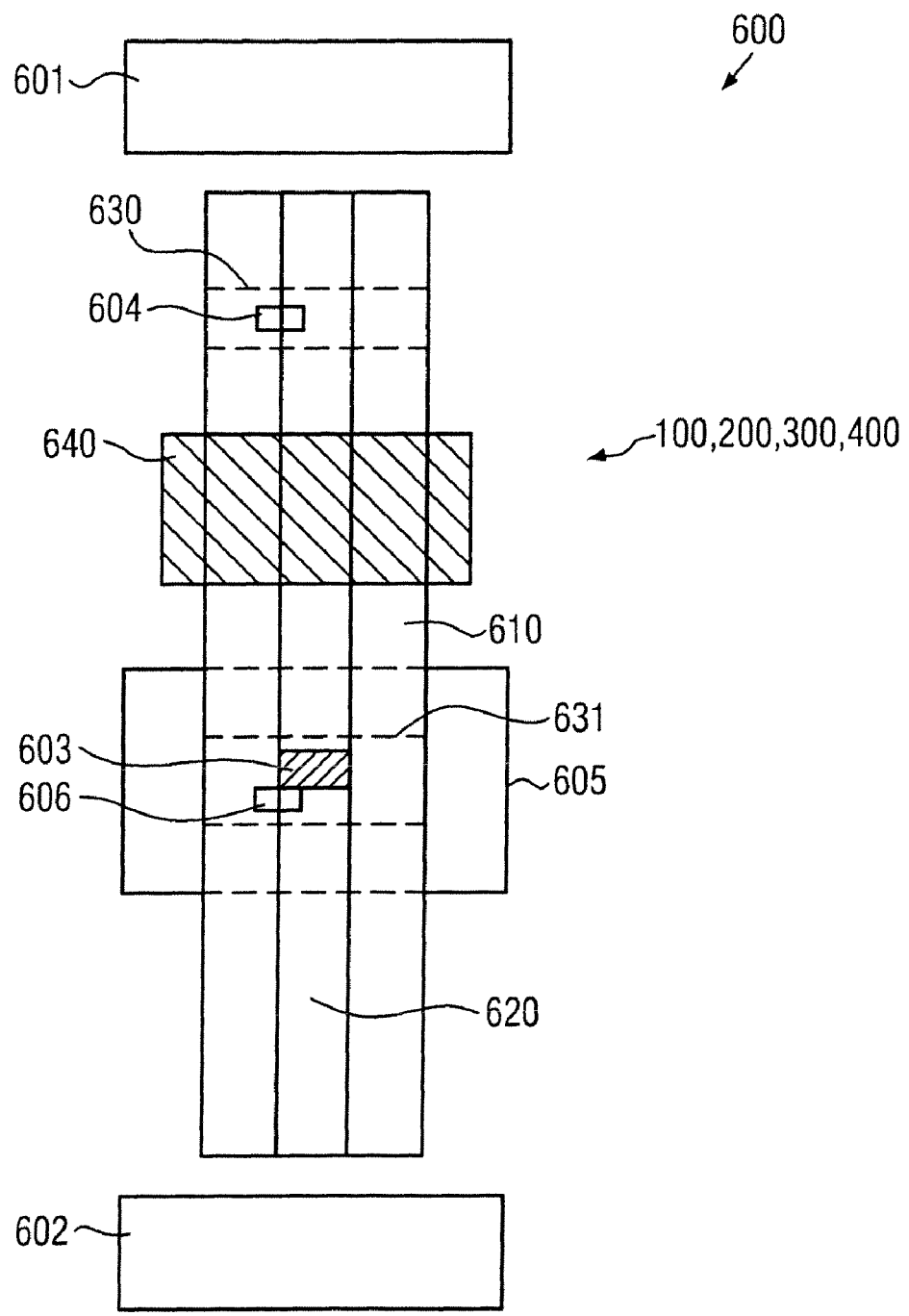
FIG. 6 shows a test apparatus according to the present invention.

FIG. 6 shows an embodiment of a test apparatus 600 according to the present invention. This test apparatus comprises a guide device 100, 200, 300, 400 according to the present invention. Furthermore, the test apparatus 600 comprises a feeder 601 for charging the guide channel 620 with electronic devices. The guide device, in particular the guide channel, is arranged in an essentially upright position so that the electronic devices 603 will move through the guide channel 620 due to the force of gravity acting thereon. At the lower end of the guide device there is an unloading apparatus 602, which is e.g. also able to sort the tested electronic devices.

The test apparatus 600 comprises stoppers 604, 606 at which, e.g. by inserting pins laterally into the guide channel, the electronic devices 603 can be stopped for testing in the areas 630, 631. In area 630, a test at ambient temperature can be carried out, by way of example. In order to allow this, the guide device 100, 200, 300, 400 is spatially fixed at this point. Furthermore, a temperature adjustment chamber 605 is provided so that the electronic devices 603 in the area 631 of the guide device 100, 200, 300, 400 can be tested at temperatures other than the ambient temperature. The electronic devices 603 can, for example, be cooled by supplying cold nitrogen gas or their temperature can be adjusted to high temperatures by supplying hot air.

The adjusting of the temperature of the electronic devices 603 has the effect that also the guide device 100, 200, 300, 400 is exposed to these temperatures and will therefore expand or contract. The expansions occurring will be compensated by the means 640 for compensating the thermal expansion of the baseplate unit 610 so that stresses will be avoided.

The invention claimed is:

1. A guide device, comprising:
    a baseplate unit having formed therein a guide channel for guiding electronic devices, wherein at least two portions of the baseplate unit are spatially fixed;
    means for compensating the thermal expansion of the baseplate unit;
    guiderail means provided along the guide channel for covering said guide channel at least partially, wherein end portions of the guiderail means are positioned in a direction of the guide channel and are spatially fixed; and
    means for compensating the thermal expansion of the guiderail means.

2. A guide device according to claim 1, wherein said means for compensating the thermal expansion of the baseplate unit comprise a compensating region of the baseplate unit between said at least two spatially fixed portions.

3. A guide device according to claim 2, wherein the baseplate unit comprises a first and a second sub-baseplate in the direction of the guide channel, said sub-baseplates having formed between them an expansion gap in the compensating region of the baseplate unit.

4. A guide device according to claim 3, wherein the first sub-baseplate comprises a projection and the second sub-baseplate comprises a recess, said projection and said recess being so implemented that they interengage in such a way that they are movable relative to one another in the direction of the guide channel, and that the projection bridges the expansion gap so as to guide the electronic devices.

5. A guide device according to claim 3, wherein one of the sub-baseplates comprises a pin and the other sub-baseplate comprises a recess for accommodating the pin, said pin and said recess being implemented complementarily to one another, when seen in a cross-sectional view at right angles to the direction of the guide channel, and said pin being movable relative to said recess in the direction of the guide channel.

6. A guide device, comprising:
a baseplate unit having formed therein a guide channel for guiding electronic devices, wherein at least two portions of the baseplate unit are spatially fixed;
means for compensating the thermal expansion of the baseplate unit; and
guiderail means provided along the guide channel for covering said guide channel at least partially, wherein at least two areas of the guiderail means are connected to the baseplate unit, and wherein the guiderail means comprises the means for compensating the thermal expansion of the baseplate unit and/or a means for compensating the thermal expansion of the guiderail means.

7. A guide device according to claim 1, wherein the guiderail means comprises at least one guiderail, and wherein at least two areas of the at least one guiderail are connected to the baseplate unit.

8. A guide device according to claim 1, wherein the guiderail means comprises a first and a second guiderail, each of said guiderails being arranged along the guide channel in such a way that, when seen in a cross-sectional view, the guide channel is covered at least partially on both sides.

9. A guide device according to claim 1, wherein the means for compensating the thermal expansion of the guiderail means and/or the means for compensating the thermal expansion of the baseplate unit comprise a compensating region of the guiderail means.

10. A guide device according to claim 9, wherein the compensating region of the guiderail means comprises an expandable portion of each guiderail means.

11. A guide device according to claim 10, wherein the expandable portion of each guiderail means is meandrous in shape.

12. A guide device according to claim 11, wherein the meandrous portion of each guiderail means comprises alternating transverse indentations.

13. A guide device according to claim 8, wherein each guiderail comprises a first and a second sub-guiderail, said sub-guiderails having an expansion gap formed between them.

14. A guide device according to claim 13, wherein said first sub-guiderail includes an extension which, when the guide channel is seen from above, is arranged below the second sub-guiderail such that it is movable relative thereto.

15. A guide device according to claim 1, wherein the baseplate unit and the guide rail means have arranged between them a spacer for adapting the distance of the guide rail means from the guide channel.

16. A test apparatus for electronic devices, comprising
a guide device, comprising:
a baseplate unit having formed therein a guide channel for guiding electronic devices, wherein at least two portions of the baseplate unit are spatially fixed;
means for compensating the thermal expansion of the baseplate unit; and
guiderail means provided along the guide channel for covering said guide channel at least partially, wherein at least two areas of the guiderail means are connected to the baseplate unit, and wherein the guiderail means comprises the means for compensating the thermal expansion of the baseplate unit and/or a means for compensating the thermal expansion of the guiderail means.

17. A test apparatus according to claim 16, further comprising a feeder for charging the guide channel with electronic devices.

18. A test apparatus according to claim 16, wherein the guide channel is arranged in an essentially upright position and the electronic devices are adapted to be moved through the guide channel by means of the force of gravity acting thereon.

19. A test apparatus according to one of the claims 16, further comprising a stopper for stopping the electronic devices in the guide channel.

20. A test apparatus according to one of the claims 16, further comprising at least one temperature adjustment unit for electronic devices.

21. A guide device according to claim 6, wherein said means for compensating the thermal expansion of the baseplate unit comprise a compensating region of the baseplate unit between said at least two spatially fixed portions.

22. A guide device according to claim 21, wherein the baseplate unit comprises a first and a second sub-baseplate in the direction of the guide channel, said sub-baseplates having formed between them an expansion gap in the compensating region of the baseplate unit.

23. A guide device according to claim 22, wherein the first sub-baseplate comprises a projection and the second sub-baseplate comprises a recess, said projection and said recess being so implemented that they interengage in such a way that they are movable relative to one another in the direction of the guide channel, and that the projection bridges the expansion gap so as to guide the electronic devices.

24. A guide device according to claim 22, wherein one of the sub-baseplates comprises a pin and the other sub-baseplate comprises a recess for accommodating the pin, said pin and said recess being implemented complementarily to one another, when seen in a cross-sectional view at right angles to the direction of the guide channel, and said pin being movable relative to said recess in the direction of the guide channel.

25. A guide device according to claim 6, wherein the guiderail means comprises at least one guiderail, and wherein at least two areas of the at least one guiderail are connected to the baseplate unit.

26. A guide device according to claim 6, wherein the guiderail means comprises a first and a second guiderail, each of said guiderails being arranged along the guide channel in such a way that, when seen in a cross-sectional view, the guide channel is covered at least partially on both sides.

27. A guide device according to claim 6, wherein the means for compensating the thermal expansion of the guiderail means and/or the means for compensating the thermal expansion of the baseplate unit comprise a compensating region of the guiderail means.

28. A guide device according to claim 27, wherein the compensating region of the guiderail means comprises an expandable portion of each guiderail means.

29. A guide device according to claim 28, wherein the expandable portion of each guiderail means is meandrous in shape.

30. A guide device according to claim 29, wherein the meandrous portion of each guiderail means comprises alternating transverse indentations.

31. A guide device according to claim 6, wherein the baseplate unit and the guide rail means have arranged between them a spacer for adapting the distance of the guide rail means from the guide channel.

* * * * *